(12) United States Patent
Wu

(10) Patent No.: US 11,670,579 B2
(45) Date of Patent: Jun. 6, 2023

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventor: Tung-Jiun Wu, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 180 days.

(21) Appl. No.: 17/142,183

(22) Filed: Jan. 5, 2021

(65) Prior Publication Data

US 2022/0216141 A1 Jul. 7, 2022

(51) Int. Cl.
*H01L 23/522* (2006.01)
*H01L 21/768* (2006.01)
*H01L 49/02* (2006.01)

(52) U.S. Cl.
CPC ...... *H01L 23/5223* (2013.01); *H01L 21/7684* (2013.01); *H01L 21/76864* (2013.01); *H01L 21/76871* (2013.01); *H01L 21/76877* (2013.01); *H01L 23/5226* (2013.01); *H01L 28/60* (2013.01)

(58) Field of Classification Search
CPC ............ H01L 23/5223; H01L 21/7684; H01L 21/76864; H01L 21/76871; H01L 21/76877; H01L 23/5226; H01L 28/60; H01L 21/76805; H01L 23/53295
See application file for complete search history.

(56) References Cited

U.S. PATENT DOCUMENTS 9,391,016 B2 * 7/2016 Shen .................... H01L 23/5223
11,139,286 B2 * 10/2021 Ding ...................... H01L 28/20

* cited by examiner

*Primary Examiner* — Julia Slutsker
(74) *Attorney, Agent, or Firm* — WPAT Law; Anthony King

(57) ABSTRACT

A method of manufacturing a semiconductor structure includes: forming an interconnect structure including a metallization layer over a substrate; depositing a first dielectric layer over the metallization layer; depositing a second dielectric layer over and separate from the first dielectric layer; depositing a third dielectric layer over the second dielectric layer, the third dielectric layer having a Young's modulus greater than that of the first and second dielectric layers; forming a capacitor structure over the third dielectric layer; and forming a conductive via extending through the capacitor structure and the first, second and third dielectric layers and electrically coupled to the metallization layer.

20 Claims, 14 Drawing Sheets

SEMICONDUCTOR STRUCTURE AND METHOD OF MANUFACTURING THE SAME

BACKGROUND

In modern semiconductor devices and systems, integration and miniaturization of components have progressed at an increasingly rapid pace. One of the growing challenges encountered during the integration process is the arrangement of capacitors. Conventional capacitors associated with integrated circuits are usually designed with limited performance and capability due to its compatibility with other circuits. Thus, an improved capacitor-embedding structure and the manufacturing method thereof are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
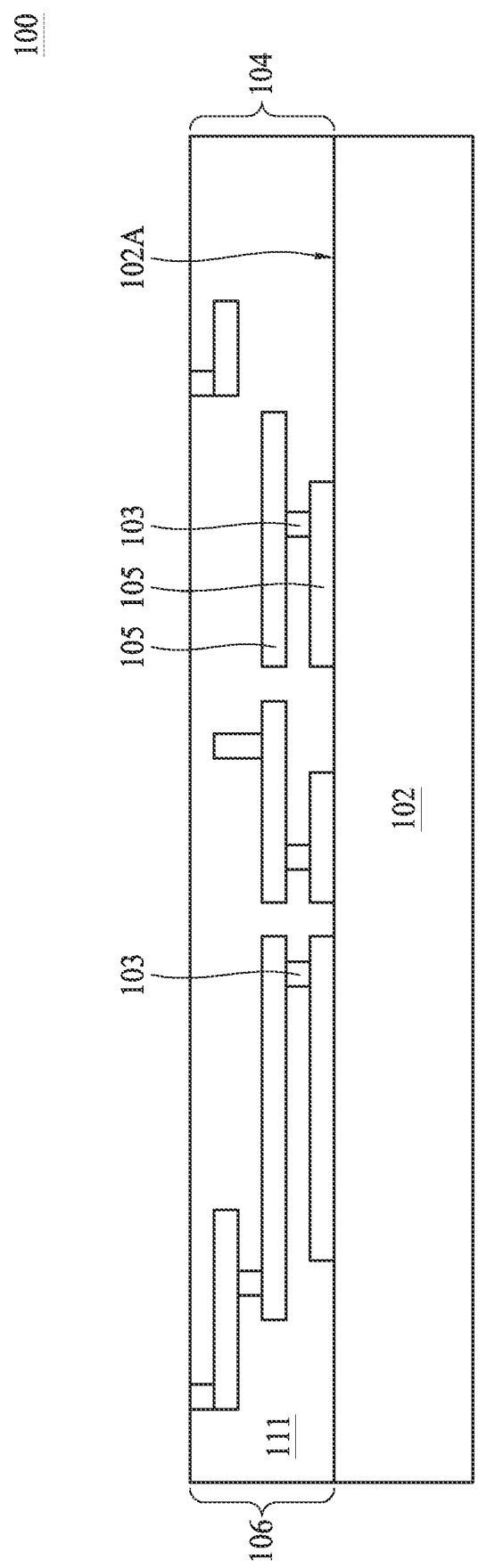
FIG. 1 to FIG. 6 are cross-sectional views of intermediate structures of a method of manufacturing a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a semiconductor device with an integrated capacitor structure and its manufacturing method, according to various embodiments. As the semiconductor industry continues to develop advanced devices, the manufacturing of the capacitor presents new challenges. A semiconductor structure may include an interconnect structure and a capacitor structure embedded in the interconnect structure. The capacitor structure is usually separated from the conductive features of interconnect structure by a buffer structure. However, the conductive lines of the interconnect structure arranged below the capacitor structure may be unintentionally shorted to the capacitor through a defect, e.g., a crack, in the buffer structure. The likelihood of the crack defect in the buffer structure may increase when the device size continues to reduce in advanced technology nodes as the reduced thickness of the buffer structure may not provide sufficient protection during the subsequent processing steps.

In the present disclosure, a new buffer structure is proposed to enhance the robustness of the existing buffer structure. The new buffer structure adopts a form of multiple layers with different stiffness levels. In addition, one or more planarization steps are introduced during the formation of the interconnect structure for ensuring planarity of the interconnect structure before the forming of the buffer structure, thereby relieving internal stress resulting from the interconnect structure. As a result, the proposed method of manufacturing the buffer structure can provide better mechanical protection of the capacitor structure and improved electrical insulation from the underlying interconnect structure. The performance of the capacitor structure may be maintained or enhanced with a reduced overall device size.

FIG. 1 to FIGS. 6, 7A and 8 to 12 are cross-sectional views of intermediate structures of a method of manufacturing a semiconductor device 100, in accordance with some embodiments. FIGS. 7B and 7C are cross-sectional views of alternative structures for the embodiment shown in FIG. 7A.

Referring to FIG. 1, a substrate 102 is received or provided. The substrate 102 (also referred to as a die substrate) includes a bulk semiconductor material, such as silicon. In one embodiment, the substrate 102 may include other semiconductor materials, such as silicon germanium, silicon carbide, gallium arsenide, or the like. The substrate 102 may be a p-type semiconductive substrate (acceptor type) or an n-type semiconductive substrate (donor type). Alternatively, the substrate 102 may include another elementary semiconductor, such as germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In another alternative, the substrate 102 may be a semiconductor-on-insulator (SOI). In still other alternatives, the substrate 102 may include a doped epitaxial layer, a gradient semiconductor layer, or a semiconductor layer overlaying another semiconductor layer of a different type, such as a silicon layer on a silicon germanium layer.

Various electrical components may be formed on a front surface (front side) 102A of the substrate 102. Examples of the electrical components include active devices, such as transistors, and passive devices, such as capacitors, inductors, diodes and resistors. The transistors may be implemented by a planar filed-effect transistor (FET), a fin-type FET (FinFET), a gate-all-around (GAA) FET, a nanosheet FET, a nanowire FET, or the like. The electrical components may also include conductive features, such as conductive lines or conductive vias, for electrically connecting the electrical components. Some insulating features are also used to electrically insulate the electrical components. In some embodiments, the substrate 102 comprises one or more connection terminals (not shown) on the front surface 102A that are utilized to conductively couple the electrical components of the substrate 102 to overlying features or devices.

An interconnect structure 104 is formed over the substrate 102. In some embodiments, the interconnect structure 104 is configured to electrically interconnect the components on the front surface 102A the substrate 102. In some other embodiments, the interconnect structure 104 is configured to electrically couple its overlying components to the electrical components of the substrate 102. The interconnect structure 104 may include multiple metallization layers (e.g., the metallization layers in a portion 106 of the interconnect structure 104). Each of the metallization layers may include conductive wires or lines and is electrically coupled to an adjacent overlaying or underlying metallization layer through conductive vias in an intermediate metallization layer. For example, several conductive lines 105 are disposed in different metallization layers of the interconnect structure 104 and are interconnected through corresponding conductive vias 103. Moreover, the conductive lines 105 and conductive vias 103 are electrically insulated from one another. The insulation may be achieved by insulating materials, such as an inter-metal dielectric (IMD) layer 111. The forming of the interconnect structure 104 is elaborated in the following description with the metallization layer 107 as an example.

Figure 2:
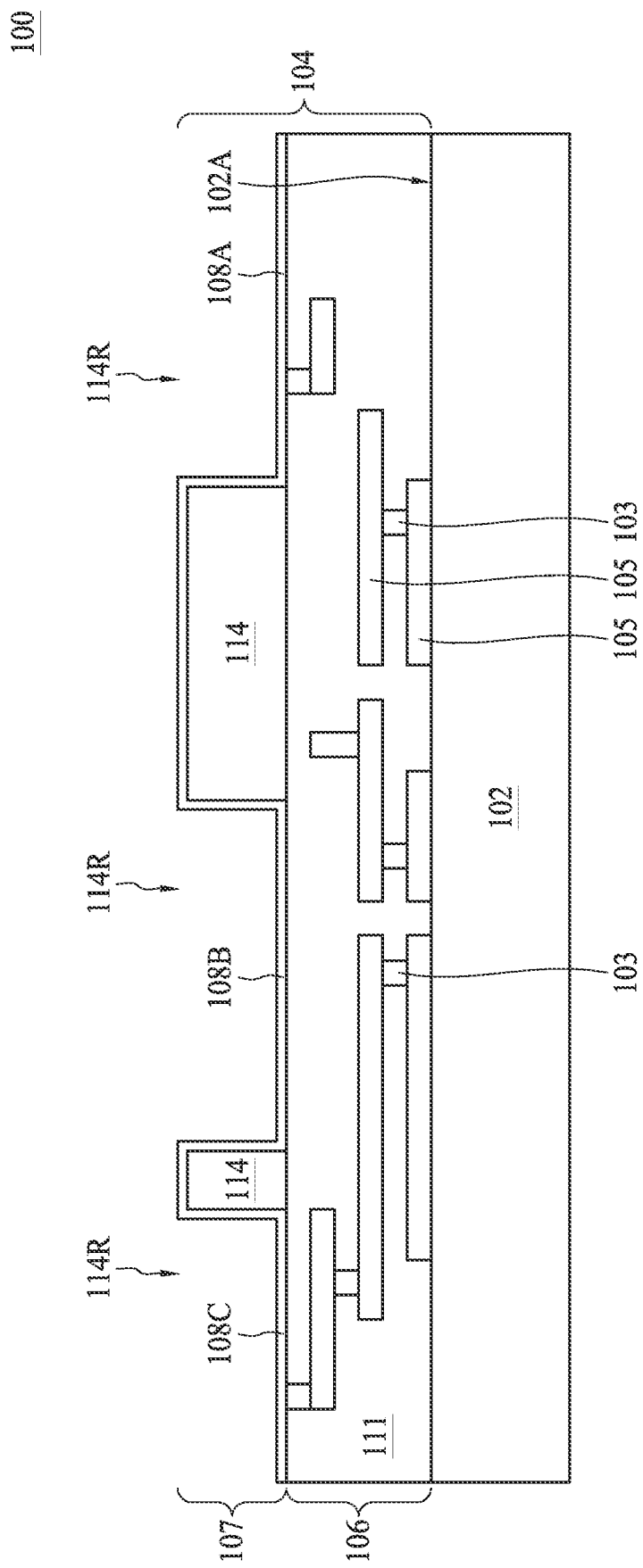

Referring to FIG. 2, when the portion 106 is completed, an IMD layer 114 is deposited on the underlying portion 106. The dielectric material of the IMD layer 114 may be formed of low-k dielectric materials. The low-k dielectric materials may have dielectric constants (i.e., k values) lower than 3.8, although the dielectric materials of the IMD layer 114 may be close to 3.8. In some embodiments, the k values of the low-k dielectric materials are lower than about 3.0 or lower than about 2.5. In an embodiment, the IMD may be formed with a variety of dielectric materials including, for example, oxides, such as un-doped silicate glass (USG), fluorinated silicate glass (FSG), Ge oxide, nitride, oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), a polymer material, or the like.

The IMD layer 114 may be formed by initially forming a blanket IMD material through a suitable process, such as chemical vapor deposition (CVD), physical vapor deposition (PVD), atomic layer deposition (ALD), spin-on coating, or the like. Next, a photoresist (not separately shown) is formed over the blanket IMD material. Patterning operations, such as lithographic and etching methods, are performed on the photoresist layer to form recesses 114R in the IMD layer 114. The etching methods may include a dry etch, a wet etch, a combination thereof, e.g., a reactive ion etch (RIE), or the like.

Subsequently, one or more conductive material are deposited into the recesses 114R to form conductive lines 112A, 112B and 112C, collectively referred to herein as conductive lines 112. The materials of the conductive lines 112 include, for example, titanium, tantalum, titanium nitride, tantalum nitride, copper, copper alloys, nickel, tin, gold, and combinations thereof. In some embodiments, the conductive lines 112 comprise a layered structure with different conductive sublayers. For example, seed layers 108A, 108B or 108C (collectively referred to herein as seed layers 108) are initially formed in a conformal manner on the bottoms and sidewalls of the respective recesses. The seed layers 108 may be formed by a conductive material, such as titanium, titanium nitride tantalum, tantalum nitride, or the like. The seed layers 108 may be formed using the CVD, PVD, ALD, electroplating, sputtering, or the like. Additionally or alternatively, barrier layers or glue layers may be deposited over the seed layer 108 or the IMD layer 114.

Figure 3:
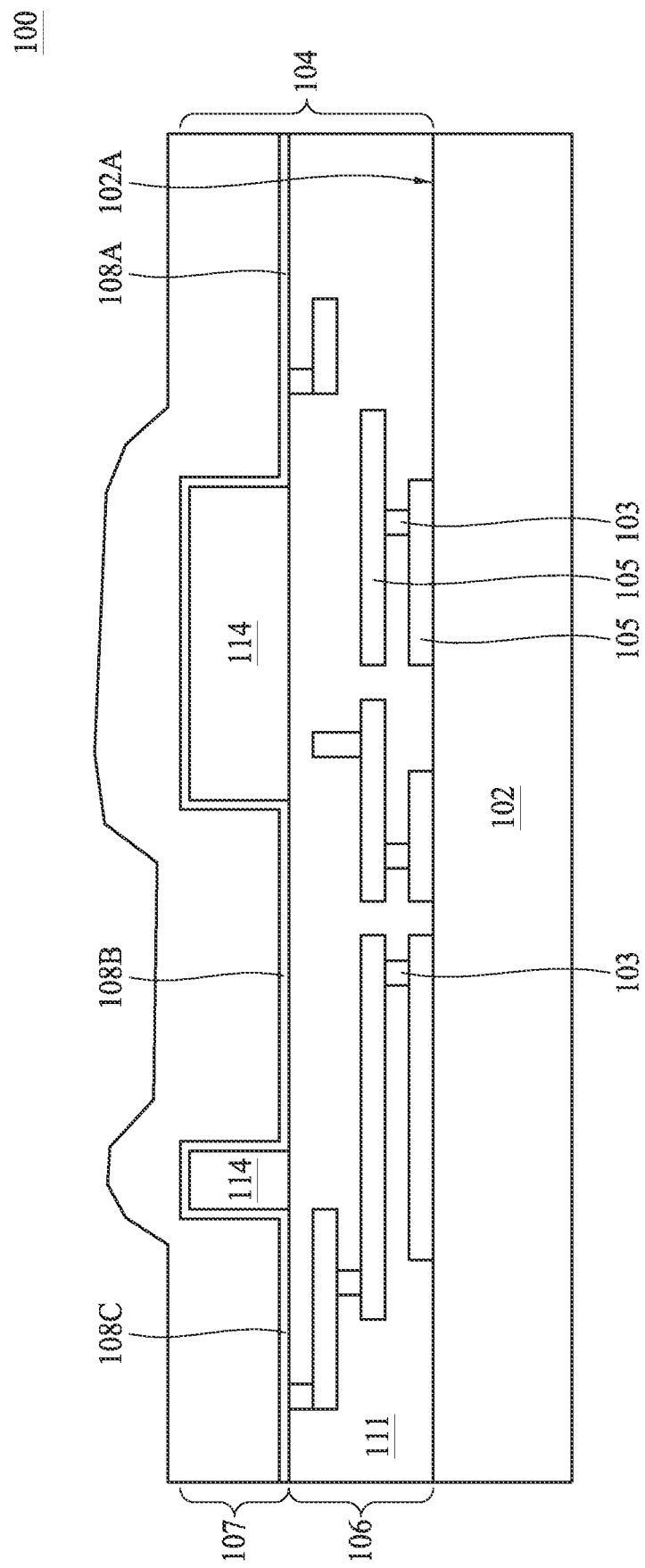

Referring to FIG. 3, a filling material 110 is deposited in the recesses 114R of the metallization layer 107. The filling material 110 may include a conductive material, such as copper, aluminum, titanium, tungsten, gold, silver, alloy thereof, or the like. The filling material 110 may be deposited using the CVD, PVD, ALD, electroplating, sputtering, or the like. In some embodiments, the filling material 110 fills the recesses 114R and excessive portions of the filling material 110 is present over the top surface of the IMD layer 114.

Figure 4:
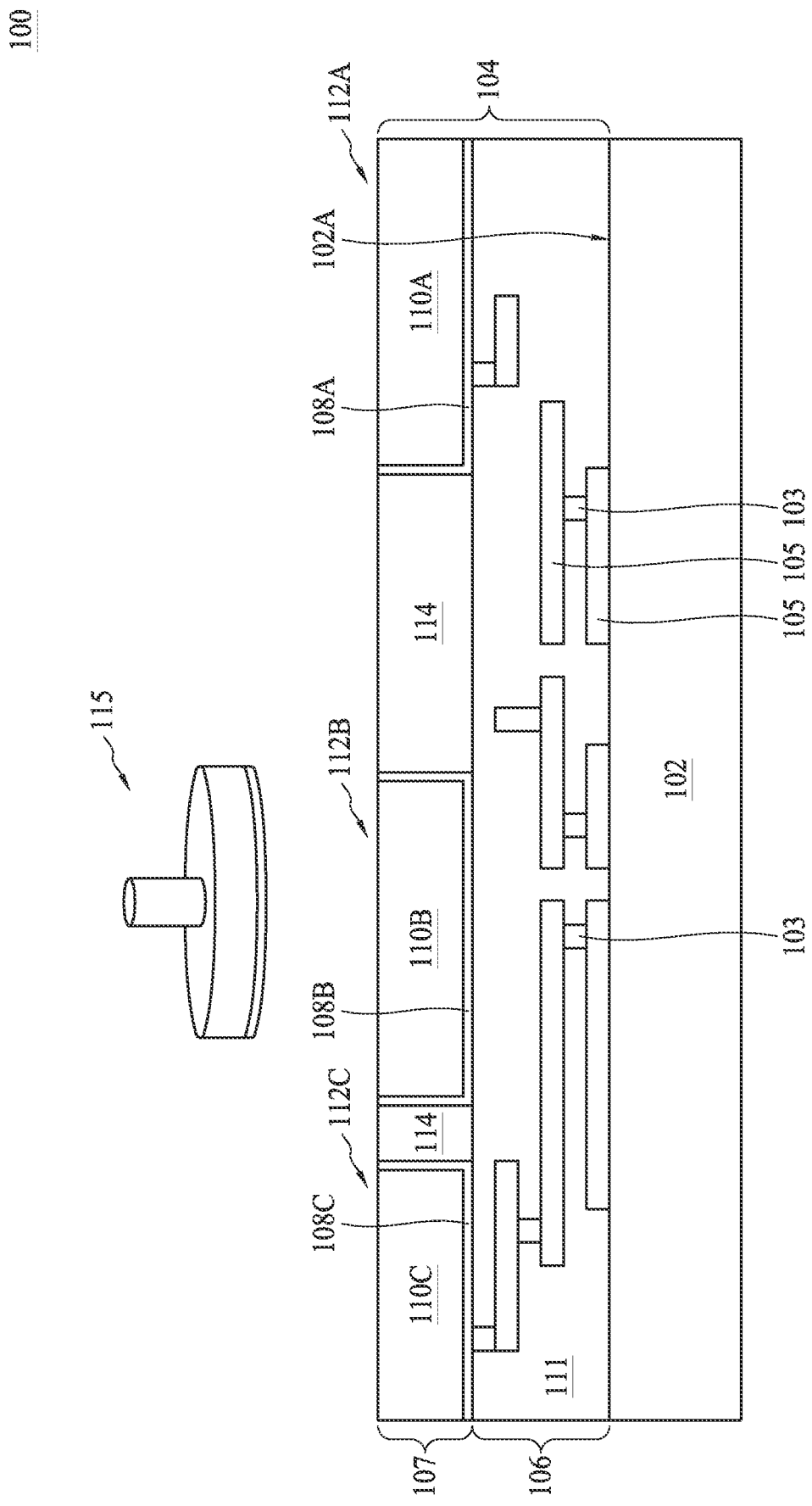

FIG. 4 illustrates a planarization operation on the metallization layer 107. The excessive portions of the filling material 110 are removed through the planarization operation. As a result, the filling materials 110A, 110B and 110C (collectively referred to herein as the filling materials 110) left in the respective recesses 114R form conductive lines 112A, 112B and 112C with the respective seed layers 108A, 108B and 108C. The planarization operation may be performed by chemical mechanical polishing (CMP), mechanical grinding, or the like through a planarization tool 115, e.g., a polishing device. Through the planarization operation, the upper surfaces of the conductive lines 112 are level with the upper surface of the IMD layer 114 or the metallization layer 107. In some embodiments, the planarized metallization layer 107 has a thickness in a range between about 11,000 Å and about 18,000 Å, or between about 14,000 Å and about 15,000 Å.

Figure 5:
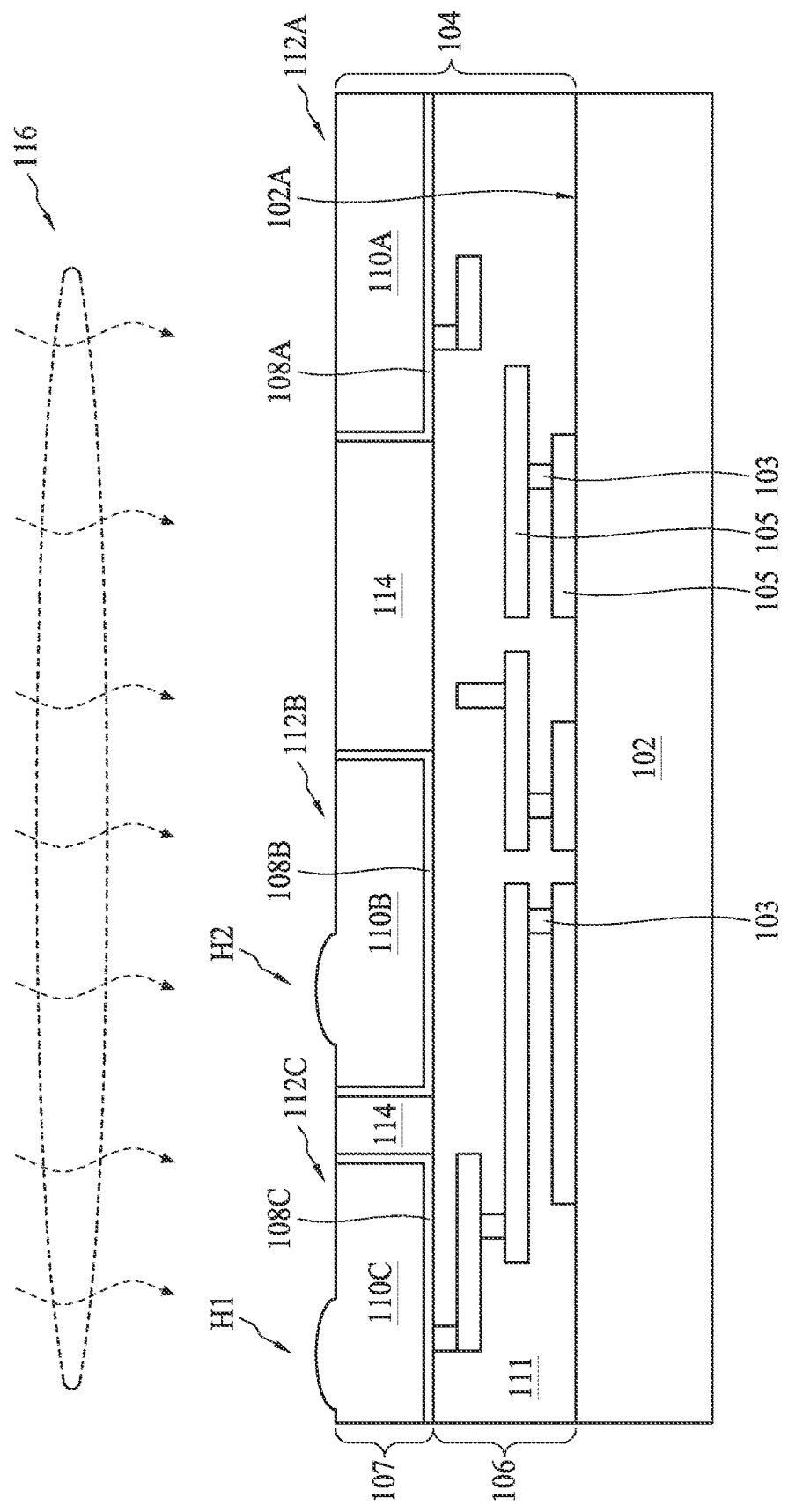

In some embodiments, the planarization operation shown in FIG. 4 induces internal stress of the filling material 110. The stress level may grow with the area of the conductive line 112 that is subject to grinding during the planarization operation. In order to relieve the stress, a treatment is introduced to the filling materials 110 of the conductive lines 112. Referring to FIG. 5, a treatment 116, such as a thermal operation 116, is performed on the conductive lines 112 or the semiconductor device 100. The thermal operation 116 may be performed at a temperature between about 350° C. and about 450° C., such as 405° C., for a period in a range between about 2.5 minutes and about 3.5 minutes, such as three minutes.

In a semiconductor device such as the semiconductor device 100, a metallization layer in a lower portion of the interconnect structure 104 that is closer to the substrate 102 (such as the portion 106) may have less line width and greater line density than another metallization layer in a higher portion of the interconnect structure 104 (such as the metallization layer 107). When incorporated into the semiconductor device 100, a capacitor structure, e.g., capacitor structure 303 shown in FIG. 8 to FIG. 12, may be formed over or embedded in a higher portion of the interconnect structure 104 such that larger areas can be allocated to the electrodes of the capacitor structure 303. In some embodiments, the capacitor structure 303 is implemented using the method of manufacturing the interconnect structure 104, and thus the capacitor structure 303 can be seen as an upper portion of the interconnect structure 104, in which a buffer structure 204 is arranged between the lower portion (including the portion 106 and the metallization layer 107) and the upper portion (capacitor structure 303) for provide mechanical support and electrical insulation therebetween.

In some embodiments, a portion of the conductive lines 112 thickens during the treatment 116, thereby forming protrusion H1 and H2 extruding from the surfaces of the conductive lines 110C and 110B, respectively. The protrusions H1 and H2 may result from movement of conductive atoms of the conductive materials 110 caused by the treatment 116. In some embodiments, in a subsequent operation in which an overlying layer, such as the buffer structure 204, is formed over the metallization layer 107, the buffer structure 204 may experience greater stress in areas contacting the protrusions H1 and H2 than other areas. As a result, a material defect, such as crack, is likely to occur in these high-stress areas of the buffer structure 204 during subsequent manufacturing steps. The damaged buffer structure 204 may no longer provide adequate insulation between the conductive lines 112 and the other features as desired.

Figure 6:
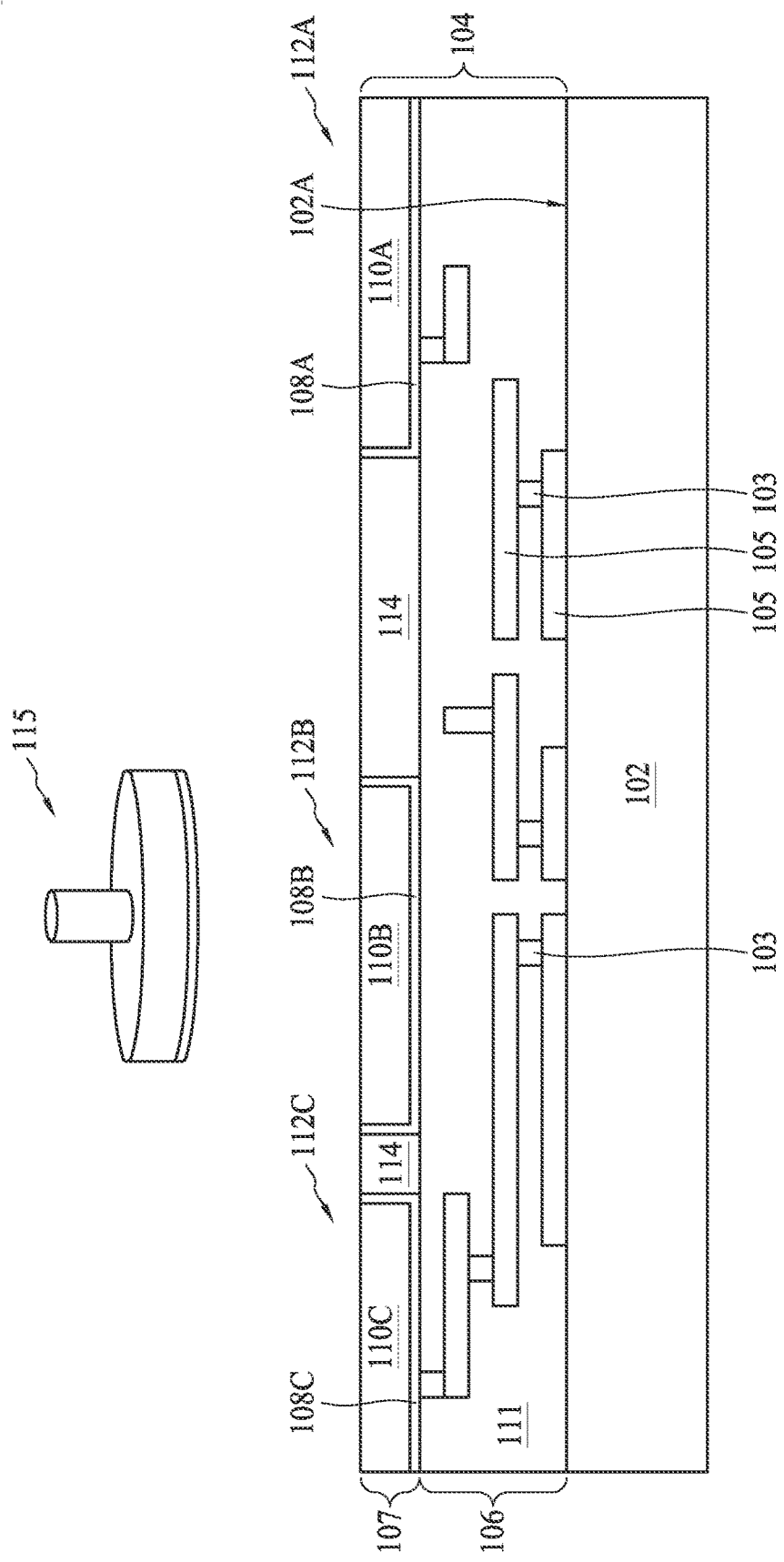

Referring to FIG. 6, another planarization operation is performed on the metallization layer 107. The protrusions H1 and H2 are removed through the planarization operation. The planarization operation may be performed by CMP, mechanical grinding, laser etch, plasma etch, or the like through the planarization tool 115. Through the planarization operation, the upper surfaces of the conductive lines 112 are level with the upper surface of the IMD layer 114 or the metallization layer 107. In some embodiments, the metallization layer 107 is also thinned, in which a thickness of the metallization layer 107 is removed through the planarization operation to ensure complete removal of any probable protrusions. The planarized metallization layer 107 has a thickness in a range between about 7,000 Å and about 10,000 Å, or between about 8,000 Å and about 9,000 Å.

In some embodiments, another stress-relieving treatment is performed to release the stress caused by the planarization operation shown in FIG. 6. As a result, new protrusions may build up on the surfaces of the conductive lines 112, although the new protrusions caused by the subsequent stress-releasing treatment, e.g., a thermal operation, may have a less volume and a lower quantity than those caused by the treatment 116. In some embodiments, the steps shown in FIG. 4 and FIG. 5 are iterated to obtain the metallization layer 107 with better planarity and more uniform stress distribution, according to some embodiments.

Figure 7A:
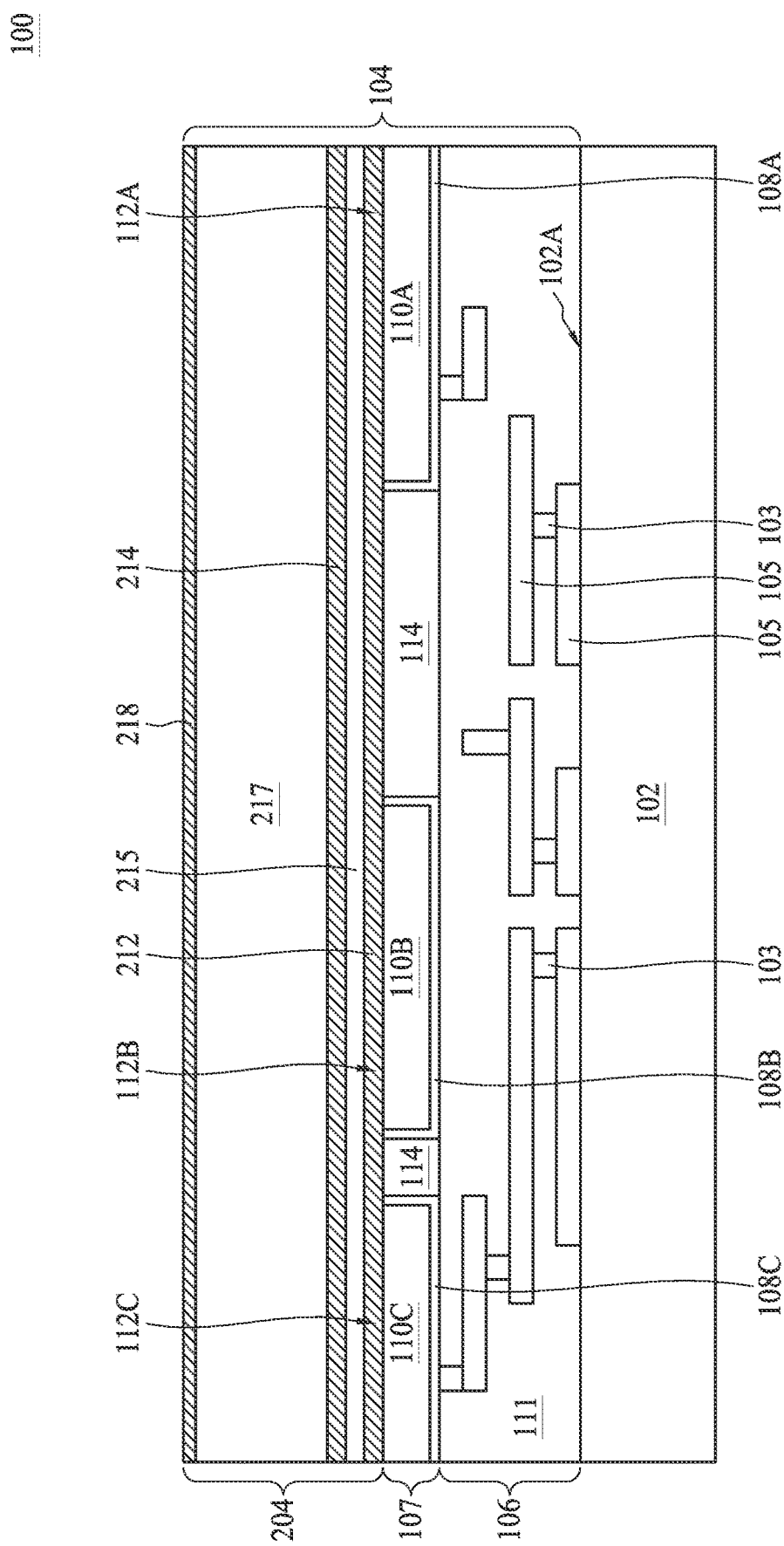
FIGS. 7A to 7C are cross-sectional views of intermediate structures of a method of manufacturing a semiconductor device, in accordance with some embodiments.
Figure 7B:
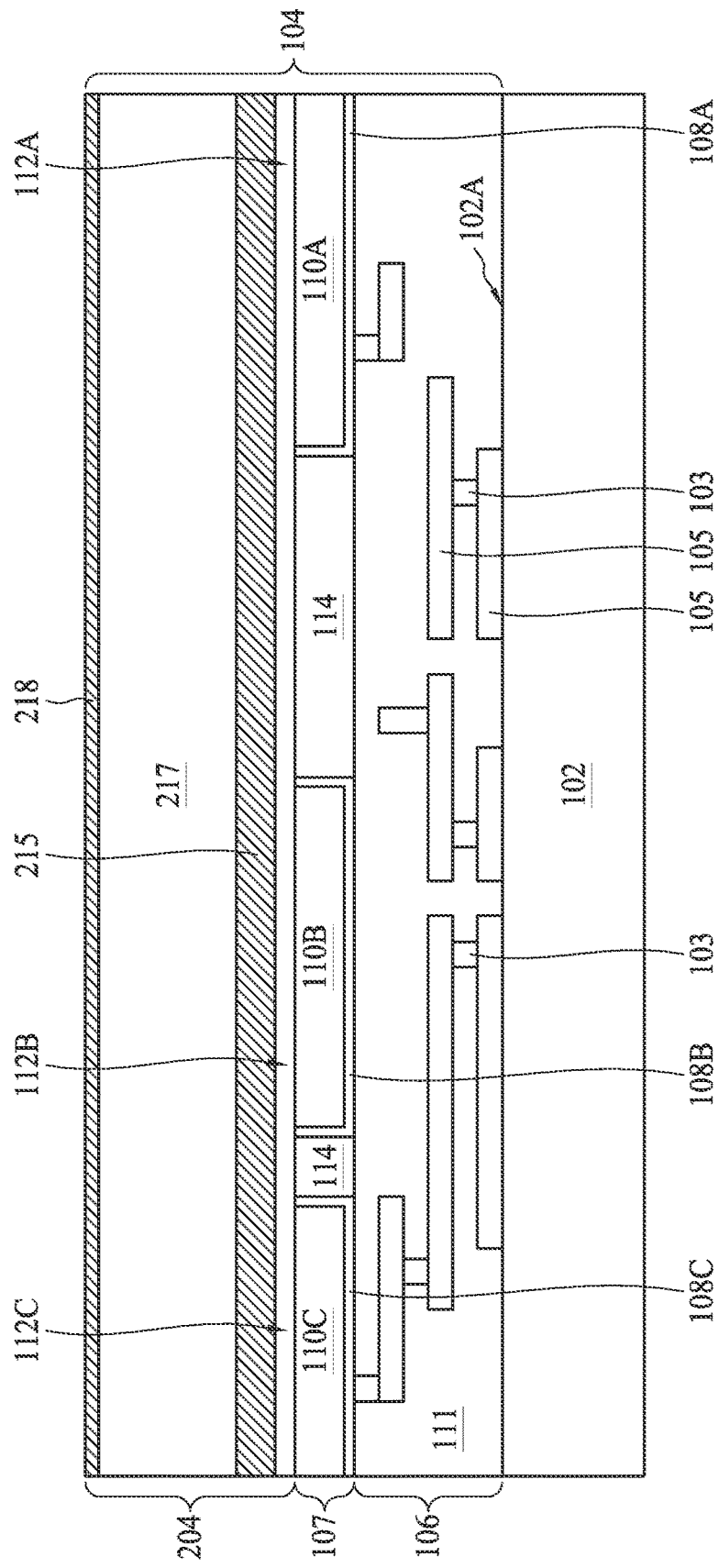
Figure 7C:
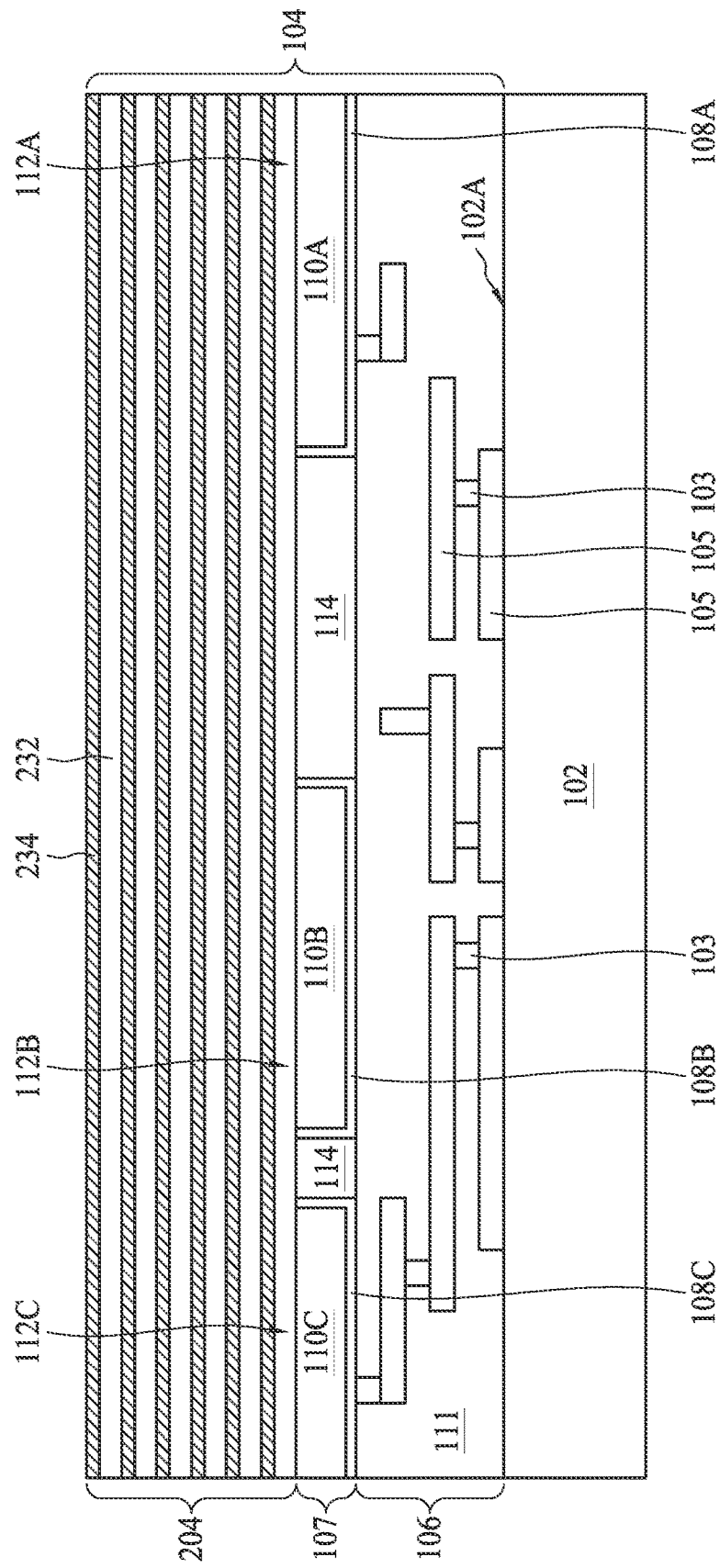

Referring to FIG. 7A, the buffer structure 204 is formed over the metallization layer 107. In some embodiments, the buffer structure 204 is configured to provide insulation between the metallization layer 107 and the capacitor structure 303. The buffer structure 204 is comprised of a stack of first dielectric layers 215, 217 and second dielectric layer 212, 214, 218 arranged over one another. In some embodiments, the first dielectric layers 215, 217 and the second dielectric layers 212, 214, 218 are formed of silicon nitride, silicon oxide, silicon carbide, silicon oxynitride, or the like. In some embodiments, the first dielectric layers 215, 217 are formed of materials different from the second dielectric layers 212, 214, 218. The first dielectric layers 215, 217 or the second dielectric layers 212, 214, 218 may be successively formed by CVD, PVD, ALD, spin-on coating, or the like. In some embodiments, a planarization operation, such as CMP, mechanical grinding, or the like, is performed to planarize the upper surfaces of the dielectric layers 212, 214, 215, 217, 218.

In some embodiments, the configurations of the buffer structure 204, such as the number of layers, the materials and the arrangement of the first dielectric layers 215, 217 and the second dielectric layer 212, 214, 218 are determined to provide sufficient protection of the underlying metallization layer 107. In case one or more protrusions build up on the surfaces of the conductive lines 112 of the metallization layer 107 during subsequent operations, the strengthened buffer structure 204 is capable of withstanding relatively high stress around the protrusions and maintaining its structural integrity. As such, the numbers of the first dielectric layers and second dielectric layers shown in FIG. 7A are for illustrational purposes only. Other numbers and configurations of the dielectric layers in the buffer structure 204 are within the contemplated scope of the present disclosure.

In some embodiments, the second dielectric layers 212, 214 and 218 have hardness different from, e.g., greater than, a hardness of the first dielectric layers 215 and 217 or a hardness of the IMD layer 114. In some embodiments, a Young's modulus of the second dielectric layers 212, 214, 218 is different from, e.g., greater than, a Young's modulus of the first dielectric layers 215, 217 or a Young's modulus of the IMD layer 114 for increasing stiffness of the buffer structure 204. For example, the first dielectric layer 215 or 217 is formed of silicon oxide, silicon dioxide, or the like, while the second dielectric layer 212, 214 or 218 is formed of silicon nitride or high-k dielectric materials (with dielectric constant greater than about 3.9) in the depicted embodiment.

In some embodiments, the second dielectric layer 218 is arranged on a topmost layer of the buffer structure 204 and in direct contact with the subsequently formed capacitor structure 303, in which the second dielectric layer 218 has a Young's modulus substantially equal to or greater than the Young's modulus' of the remaining layers of the buffer structure 204. In this way, the propagation of cracks, which may occur from the bottom surface of the buffer structure 204 adjacent to the metallization layer 107 and run upwardly through the buffer structure 204, can be prevented or alleviated.

In some embodiments, the dielectric layers 212, 214, 218 have a dielectric constant (k value) different from, e.g., greater than, the dielectric constant of the dielectric layers 215, 217. In some embodiments, the dielectric layers 212, 214, 218 have a density different from, e.g., greater than, the density of the dielectric layers 215, 217. In some embodiments, the dielectric layer 212, 214 or 218 are formed of high-k dielectric material. In some embodiments, the dielectric layers 212, 214, 218 may be formed of $Al_2O_3$, $HfO_2$, $ZrO_2$, $HfO_xN_y$, $ZrO_xN_y$, $HfSi_xO_y$, $ZrSi_xO_y$, $HfSi_xO_yN_z$, $ZrSi_xO_yN_z$, $TiO_2$, $Ta_2O_5$, $La_2O_3$, $CeO_2$, $Bi_4Si_2O_{12}$, $WO_3$, $Y_2O_3$, $LaAlO_3$, $Ba_{1-x}Sr_xTiO_3$, $PbTiO_3$, $BaTiO_3$ (BTO), $SrTiO_3$ (STO), $BaSrTiO_3$ (BST), $PbZrO_3$, lead-strontium-titanate (PST), lead-zinc-niobate (PZN), lead-zirconate-titanate (PZT), lead-magnesium-niobium (PMN), yttria-stabilized zirconia (YSZ), $ZrO_2/Al_2O_3/ZrO_2$ (ZAZ), a combination thereof, or the like. In some embodiments, one of the dielectric layers 212, 214 and 218, e.g., the second dielectric layer 218, are formed of high-k dielectric layer while the others, e.g., the second dielectric layers 212, 214, are formed of silicon nitride.

The second dielectric layer 212 may have a thickness between about 750 Å and about 1000 Å, such as 900 Å. The second dielectric layer 214 may have a thickness between about 750 Å and about 1000 Å, such as 900 Å. In some embodiments, the first dielectric layer 215 has a thickness in a range between about 300 Å and about 500 Å, such as 400 Å. In some embodiments, the first dielectric layer 217 has a thickness in a range between about 2000 Å and about 3000 Å, such as 2500 Å. In some embodiments, the second dielectric layer 218 has a thickness in a range between about 750 Å and about 1000 Å, such as 900 Å.

In some embodiments, the buffer structure 204 has a total thickness between about 4500 Å and about 6400 Å, such as 5500 Å. In some embodiments, if the buffer structure 204 has a total thickness less than about 4500 Å, the buffer structure 204 may not be able to provide adequate mechanical strength and stiffness for preventing protrusions of the conductive lines 112 from breaking the buffer structure 204. In some embodiments, if the buffer structure 204 has a total thickness greater than about 6400 Å, the resultant thickness of the semiconductor device 100 may not meet the requirement of device size.

As previously discussed, the thicknesses of the component dielectric layers in the buffer structure 204 are determined to provide sufficient stiffness. In this connection, the total thickness of the second dielectric layers 212, 214, 218 is greater than a predetermined percentage. Further, the buffer structure 204 is configured to be compatible with the adjacent layers, such as the IMD layer 114, in order not to exert extra stress on the IMD layer 114. In this connection, since the material of the first dielectric layers 215, 217 is similar to the IMD layer 114, e.g., made of silicon oxide, the total thickness of the second dielectric layers 212, 214, 218 is less than a predetermined percentage. In some embodiments, the total thickness of the second dielectric layers 216, 218 are in a range between about 25% and about 75% or between about 45% and about 55% of the thickness of the buffer structure 204.

The embodiment shown in FIG. 7A illustrates that the buffer structure 204 includes the second dielectric layer 212 over and in direct contact with the metallization layer 107. In some embodiments, the second dielectric layer 212 is formed of a material with a Young's modulus greater than that of the first dielectric layer 215 or 217 (FIG. 7A). As a result, the buffer structure 204 may provide better protection against protrusion-induced stress by the protrusions of the metallization layer 107.

FIG. 7B illustrates the buffer structure 204 according to another embodiment. Referring to FIG. 7A and FIG. 7B, the buffer structure 204 shown in FIG. 7B includes the first dielectric layers 215, 217 and second dielectric layers 216 and 218 alternatingly arranged with the first dielectric layers 215, 217. The materials, configurations and method of forming for the second dielectric layer 216 are similar to those of the second dielectric layer 212 or 214, and thus their descriptions are omitted for brevity unless stated otherwise.

In some embodiments, the second dielectric layers 212, 214 shown in FIG. 7A is replaced by the second dielectric layer 216 shown in FIG. 7B. The second dielectric layer 216 may be formed of materials similar to the second dielectric layer 212 or 214. In some embodiments, the second dielectric layer 216 has a thickness in a range between about 1500 Å and about 2000 Å, such as 1800 Å.

The embodiment shown in FIG. 7B illustrates that the buffer structure 204 includes the first dielectric layer 215 over and in direct contact with the metallization layer 107. In some embodiments, the first dielectric layer 215 and the IMD layer 114 are formed of similar materials, such as silicon oxide or silicon dioxide. The first dielectric layer 215 may thus have a Young's modulus closer to that of the IMD layer 114 than the second dielectric layer 216 and provide a closer match of stress levels between the buffer structure 204 and the metallization layer 107.

FIG. 7C illustrates the buffer structure 204 according to yet another embodiment. Referring to FIGS. 7A, 7B and 7C, the buffer structure 204 shown in FIG. 7C includes first dielectric layers 232 and second dielectric layers 234 alternatingly arranged with the first dielectric layers 232. The materials, configurations and method of forming for the first dielectric layer 232 and the second dielectric layer 234 are similar to those of the first dielectric layer 215 and the second dielectric layer 216, respectively, and thus the their descriptions are omitted for brevity unless stated otherwise.

The embodiment shown in FIG. 7C illustrates that the buffer structure 204 includes six pairs of first and second dielectric layers 232 and 234, which numbers are more than the numbers of the first and second dielectric layers shown in FIGS. 7A and 7B. As will be seen in FIG. 11, conductive vias 322 are formed to extend through the buffer structure 204. In some embodiments, the first dielectric layers 215, 217 and 232 are configured to generate a first type stress, e.g., tensile stress, on the conductive vias 322. The second dielectric layers 212, 214, 216, 218 and 234 are configured to generate a second type stress, e.g., compressive stress, on the conductive vias. 322. In some embodiments, the first dielectric layers 232 are configured to generate the second type stress, e.g., compressive stress, on the conductive vias 322 and the second dielectric layers 234 are configured to generate the first type stress, e.g., tensile stress, on the conductive vias. 322. The alternatingly arranged first dielectric layers and the second dielectric layers shown in FIGS. 7A, 7B and 7C may help to balance the stresses of opposite types exerted on the features within or adjacent to the buffer structure 204. Further, the uniformly distributed and alternatingly arranged first dielectric layers 232 and second dielectric layers 234 as shown in FIG. 7C may help provide better balance of stress on the conductive vias 322 exerted by the laterally surrounded first dielectric layers 322 and the second dielectric layers 324. In some embodiments, the thickness of each first dielectric layer 232 or each second dielectric layer 234 is tunable and depends upon the total thickness of the buffer structure 204.

FIG. 8 to FIG. 12 illustrates the formation of the capacitor structure 303 of the interconnect structure 104 over the buffer structure 204 in continuation of the step shown in one of FIG. 7A, FIG. 7B and FIG. 7C. In the depicted example, the capacitor structure 303 is formed subsequent to the embodiment shown in FIG. 7A.

Figure 8:
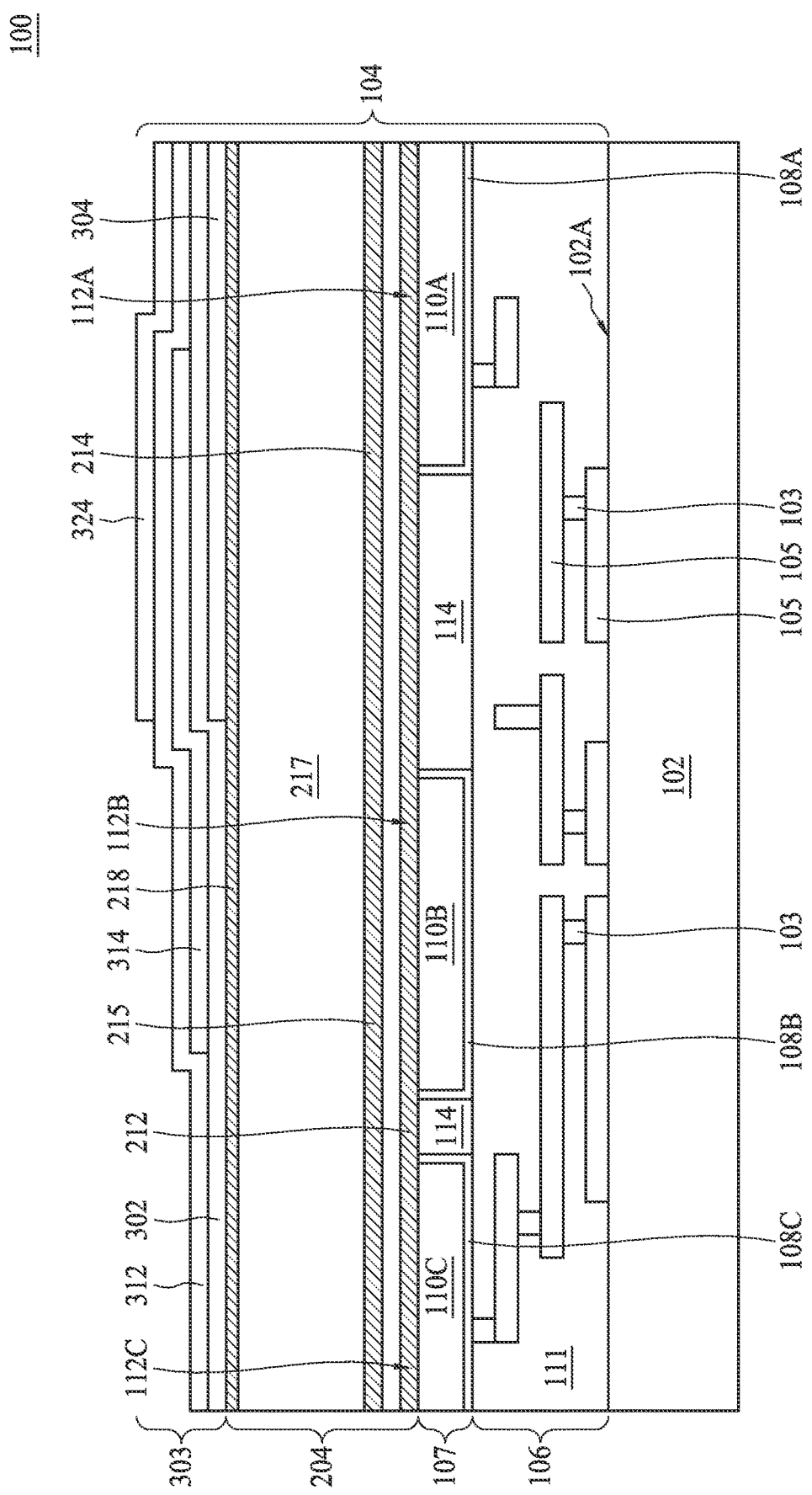
FIG. 8 to FIG. 12 are cross-sectional views of intermediate structures of a method of manufacturing a semiconductor device, in accordance with some embodiment.

Referring to FIG. 8, a patterned first conductive layer 304 is formed over the buffer structure 204. In an embodiment, the first conductive layer 304 serves as an electrode or conductive plate (such as conductive layers 304 and 314, which are discussed later) of the capacitor structure 303. In some embodiments, the first conductive layer 304 has a shape of a plate, a sheet, or a strip from a top-view perspective. The first conductive layer 304 may include conductive materials such as copper, silver, aluminum, gold, tungsten, titanium, titanium nitride, tantalum, tantalum nitride or combinations thereof. In some embodiments, the thickness of the first conductive layer 304 is between about 200 Angstrom and about 500 Angstrom, for example 400 Angstrom. In some embodiments, the sidewall of the first conductive layer 314 may be formed as a right angle or have a slope.

The first conductive layer 304 may be formed using lithography and etching operations. As an example procedure, the first conductive layer 304 is formed by initially depositing a conductive material over the buffer structure 204. A patterning operation is performed to pattern the first conductive layer 304. In some embodiments, one or more openings (not shown) are formed which exposes a portion of the buffer structure 204 corresponding to the conductive lines 112 for facilitating the formation of conductive vias on the conductive lines 112.

A first insulating film 302 is deposited over the buffer structure 204 and the first conductive film 304 serves as an electrical insulating material between a pair of electrodes of a capacitor structure 303. Generally, if the dielectric constant of the first insulating film 302 increases, the required thickness for the first insulating film 302 can be decreased for providing similar insulation performance. In some embodiments, the thickness of the first insulating film 302 is between about 30 Angstrom and about 100 Angstrom, for example 60 Angstrom. In some embodiments, the first insulating film 302 covers the first conductive layer 304 in a conformal manner. In an embodiment, the first insulating film 302 covers the buffer structure 204 and the conductive lines 112. In an embodiment, the first insulating film 302 covers sidewalls of the first conductive layer 304.

The first insulating film 302 may be formed of a dielectric material, such as silicon oxide, silicon nitride, silicon oxynitride, metal oxides, metal nitride, metal silicates, transition metal oxide, transition metal nitride, transition metal silicates oxynitrides of metal, metal aluminate, zirconium silicate, zirconium aluminate, or the like. In some embodiments, the first insulating film 302 may be formed of a high-k dielectric material. In some embodiments, the first insulating film 302 may be formed of $Al_2O_3$, $HfO_2$, $ZrO_2$, $HfO_xN_y$, $ZrO_xN_y$, $HfSi_xO_y$, $ZrSi_xO_y$, $HfSi_xO_yN_z$, $ZrSi_xO_yN_z$, $TiO_2$, $Ta_2O$, $La_2O_3$, $CeO_2$, $Bi_4Si_2O_{12}$, $WO_3$, $Y_2O_3$, $LaAlO_3$, $Ba_{1-x}Sr_xTiO_3$, $PbTiO_3$, $BaTiO_3$ (BTO), $SrTiO_3$ (STO), BaSrTiO_3 (BST), $PbZrO_3$, lead-strontium-titanate (PST), lead-zinc-niobate (PZN), lead-zirconate-titanate (PZT), lead-magnesium-niobium (PMN), yttria-stabilized zirconia (YSZ), $ZrO_2/Al_2O_3/ZrO_2$ (ZAZ), a combination thereof, or the like. In the present embodiment, the first insulating film 302 includes ZAZ, which possesses a dielectric constant greater than a dielectric constant of the IMD layer 114 and the second dielectric layers 212, 214, 216, 218, 234. The first insulating film 302 may be formed using CVD, PVD, ALD, or other suitable deposition operations. In the present embodiment, the first insulating film 302 possesses a dielectric constant substantially equal to or greater than the first dielectric layers 215, 217, 232.

A patterned second conductive layer 314 is formed over the first insulating film 302 and the first conductive layer 304. In an embodiment, the second conductive layer 314 serves a second electrode or conductive plate of the capacitor structure 303. In some embodiments, the second conductive layer 314 has a shape of a plate, a sheet, or a strip from a top-view perspective. The second conductive layer 314 may include conductive materials such as copper, silver, aluminum, gold, tungsten, titanium, titanium nitride, tantalum, tantalum nitride or combinations thereof. The second conductive layer 314 may be formed of a material the same as or different from the first conductive layer 304.

In some embodiments, the thickness of the second conductive layer 314 is between about 200 Angstrom and about 500 Angstrom, for example 400 Angstrom. The forming method of the second conductive layer 314 may be similar to that of the first conductive layer 304. In some embodiments, one more openings (not shown) are formed which expose a portion of the first insulating film 302 corresponding to the conductive lines 112. In some embodiments, a portion of the first insulating film 302, for example, at locations over the conductive line 112C is exposed through the second conductive layer 314. In some embodiments, the second conductive layer 314 covers the first insulating film 302 in a conformal manner. When viewed from a cross-sectional perspective, the second conductive layer 314 extends from a first end over the first conductive layer 304 towards a second end adjacent to the conductive line 112C. A step/corner is formed in the second conductive layer 314 around the sidewall of the first conductive layer 304. The corner may have a substantially right angle or a slope.

A second insulating film 312 is formed over the second conductive layer 314 and the first insulating film 302. The second insulating film 312 serves as an electrical insulating material between another pair of electrodes (such as conductive layers 314 and 312) of the capacitor structure in the present disclosure. The manufacturing method and materials of the second insulating film 312 may be similar to those of the first insulating film 302.

In some embodiments, the thickness of the second insulating film 312 is between about 30 Angstrom and about 100 Angstrom, for example 60 Angstrom. In an embodiment, the second insulating film 312 covers the conductive layers 304 and 314 and the first insulating film 302. In an embodiment, the second insulating film 312 covers sidewalls of the second conductive layer 314. In some embodiments, the insulating films 302 and 312 have substantially equal deposition thicknesses, and thus the thickness of the insulating films 302/312 is doubled where the second insulating film 312 is formed directly on the first insulating film 302.

A patterned third conductive layer 324 is formed over the second insulating film 312 and the second conductive layer 314. In an embodiment, the third conductive layer 324 serves as yet another electrode of the capacitor structure 303. In an embodiment, the third conductive layer 324 may be conductively coupled to the first conductive layer 304 such that both conductive layers 304 and 324 collectively serve as a single electrode of the capacitor structure 303. In some embodiments, the third conductive layer 324 has a shape of a plate, a sheet, or a strip from a top-view perspective. The third conductive layer 324 may include conductive materials such as copper, silver, aluminum, gold, tungsten, titanium, titanium nitride, tantalum, tantalum nitride or combinations thereof. The third conductive layer 324 may be formed of the material the same as or different from the first conductive layer 304 or the second conductive layer 314. In some embodiments, the thickness of the third conductive layer 324 is between about 200 Angstrom and about 500 Angstrom, for example 400 Angstrom.

The forming method of the third conductive layer 324 may be similar to the forming method of the conductive layer 304 or 314. In some embodiments, a portion of the second insulating film 312, for example, at locations over the conductive lines 112B and 112C, is exposed through the third conductive layer 324. In some embodiments, the third conductive layer 324 extends from a first end directly over the second conductive layer 314 towards a second end over the conductive line 112A. A step/corner is formed in the third conductive layer 324 around the sidewall of the second conductive layer 314. The corner may have a substantially right angle or a slope.

Figure 9:
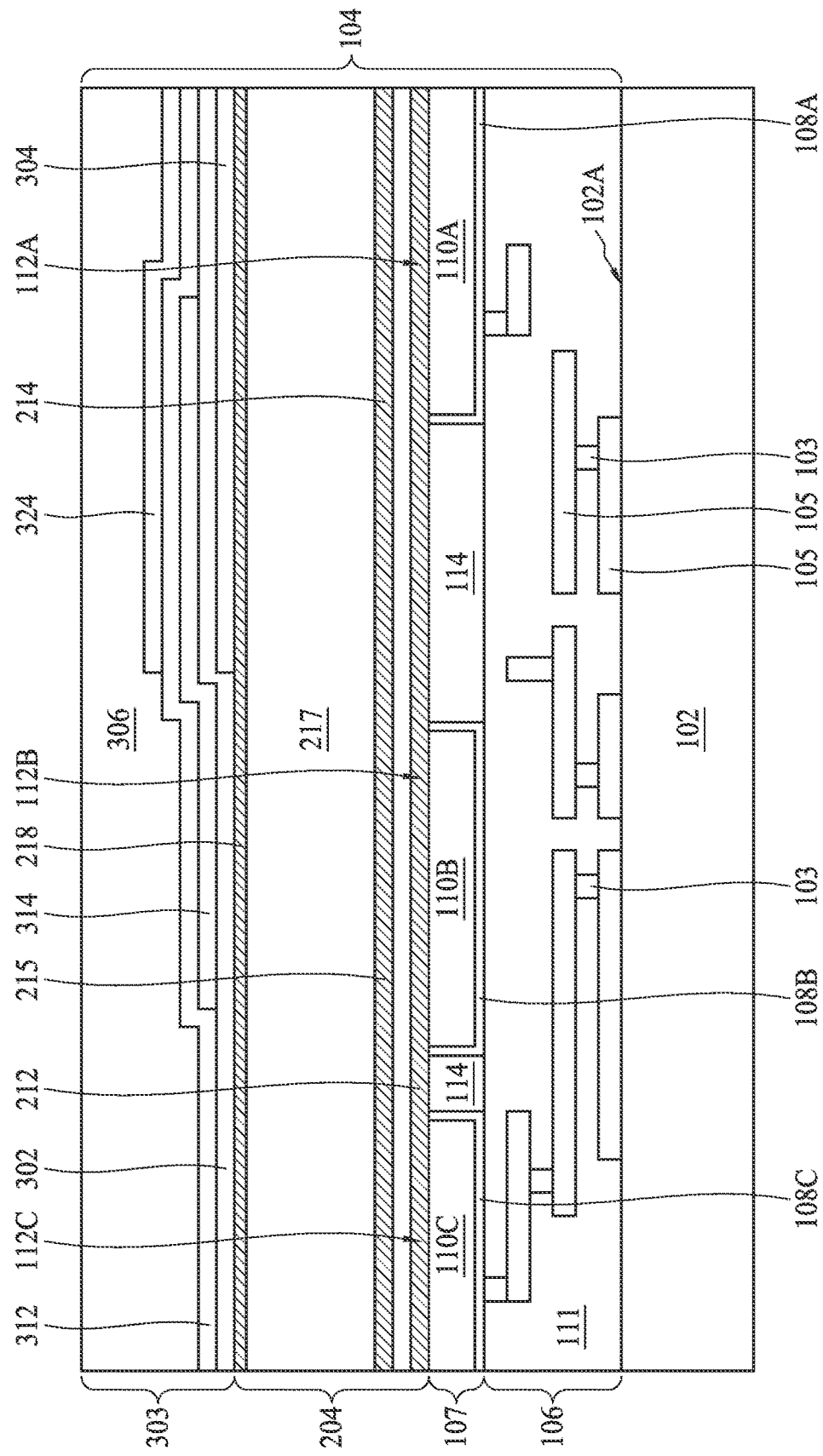
Figure 10:
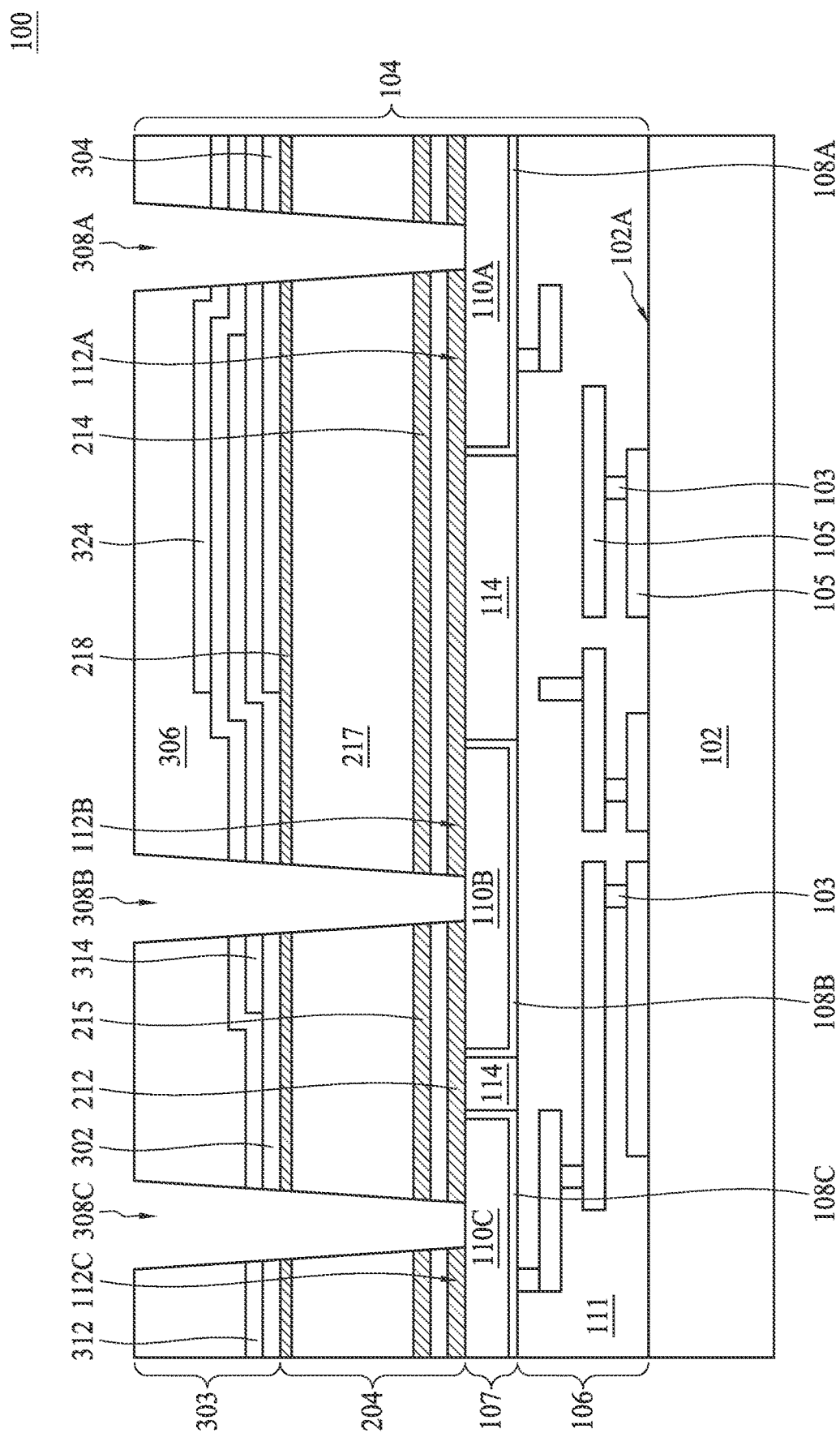

Referring to FIG. 9, a passivation layer 306 is deposited over the second insulating film 312 and the third conductive layer 324. The passivation layer 306 may comprise a dielectric material such as oxide, nitride, oxynitride, silicon dioxide, nitrogen-bearing oxide, nitrogen-doped oxide, silicon oxynitride ($Si_xO_yN_z$), polymer, or the like. In an embodiment, the passivation layer 306 has a thickness between about 6000 Angstrom and 8000 Angstrom, for example 6500 Angstrom. In an embodiment, a planarization operation, such as grinding or CMP may be employed to planarize the passivation layer 306 and remove excessive material of the passivation layer 306.

FIG. 9 shows the etching of vias 308A, 308B and 308C (collectively referred to as herein the vias 308) in the passivation layer 306. The vias 308 may be etched by e.g., a dry etch, a wet etch or a combination thereof. In some embodiments, a patterned mask layer (not shown) is formed over the passivation layer 306. The patterned mask layer may be formed of a photoresist material or a dielectric material, such as silicon nitride. The patterned mask layer includes openings that define the geometries of the vias 308. In some embodiments, the openings correspond to the respective conductive lines 112. The vias 308 are etched using the patterned mask layer as an etching mask. In the present embodiment, the vias 308 are formed during a single dry etching operation. In some embodiments, the patterned mask layer is removed or stripped after the vias 308 are formed. The vias 308 extend through the passivation layer 306, the insulating films 302 and 312, and the buffer structure 204 to expose upper surfaces of the respective conductive lines 112A, 112B and 112C. In some embodiments, the vias 308 have a sidewall tapering from an upper surface of the passivation layer 306 to the conductive lines 112.

Figure 11:
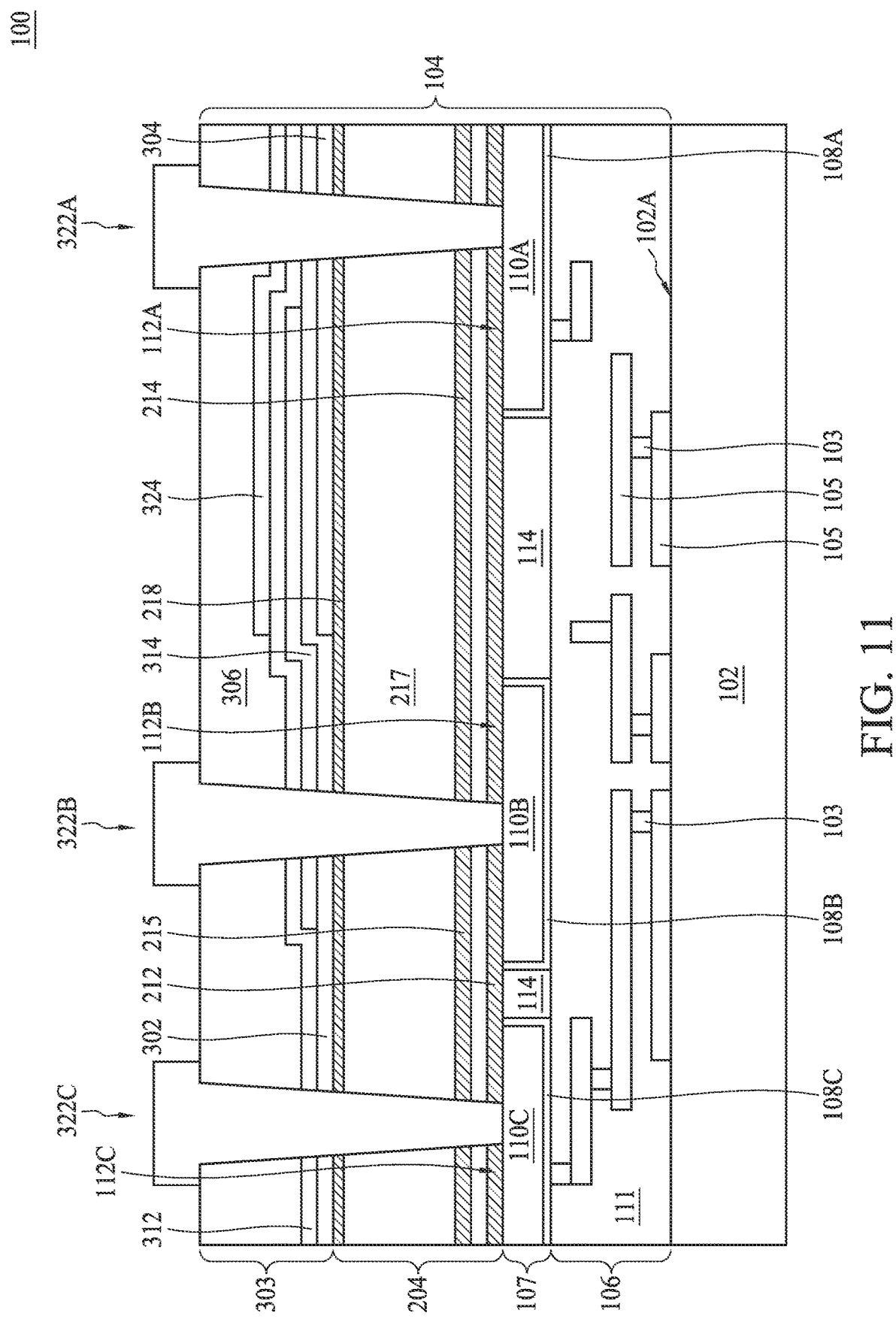

FIG. 11 illustrates a formation of conductive vias 322A, 322B and 322C (collectively referred to herein as the conductive vias 322) in the vias 308A, 308B and 308C, respectively. In some embodiments, the conductive via 322 includes a multilayer structure with different conductive sublayers. For example, seed layers, barrier layers or glue layers (not shown) are initially lined on the bottoms and sidewalls of the respective vias 308 and the upper surface of the passivation layer 306 prior to the deposition of conductive materials for the conductive vias 322. The seed layers, barrier layer or glue layers may be formed with a conductive material, such as titanium, titanium nitride, tantalum, tantalum nitride, or the like. The seed layers, barrier layers, glue layers and conductive filling materials of the conductive vias 322 may be formed using CVD, PVD, ALD, electroplating, sputtering, or the like.

A filling material is deposited into the vias 308 and over the upper surface of the passivation layer 306. Materials of the filling material include conductive materials, for example, aluminum, titanium, tantalum, titanium nitride, tantalum nitride, copper, aluminum copper, nickel, tin, gold, and combinations thereof. A patterning operation is performed on the filling material to form the conductive vias 322. Through the patterning operation, the conductive vias 322 include horizontal portions extending over the upper surface of the passivation layer 306. In some embodiment, the horizontal portions serve as contact pads or input/output pads of the semiconductor device 100 to be electrically coupled to other devices. The horizontal portions may have a thickness in a range between 25,000 Angstrom and about 30,000 Angstrom, such as 28,000 Angstrom. The horizontal portions may have a circular shape or a polygonal shape from a top-view perspective.

The first conductive layer 304 and the third conductive layer 324 are conductively coupled to each other through the conductive via 322A and electrically insulated from the second conductive layer 314; thus they can be regarded as a joint electrode of the capacitor structure 303. The second conductive layer 314 is conductively coupled to the conductive via 322B and is regarded as another electrode of the capacitor structure 303. The conductive via 322C is conductively coupled to the conductive line 112C. The conductive route including the conductive via 322C and conductive line 112C may be used for a logic device other than the capacitor structure 303. In an embodiment, the conductive via 322C is formed during the forming of the conductive vias 322A and 322B.

Figure 12:
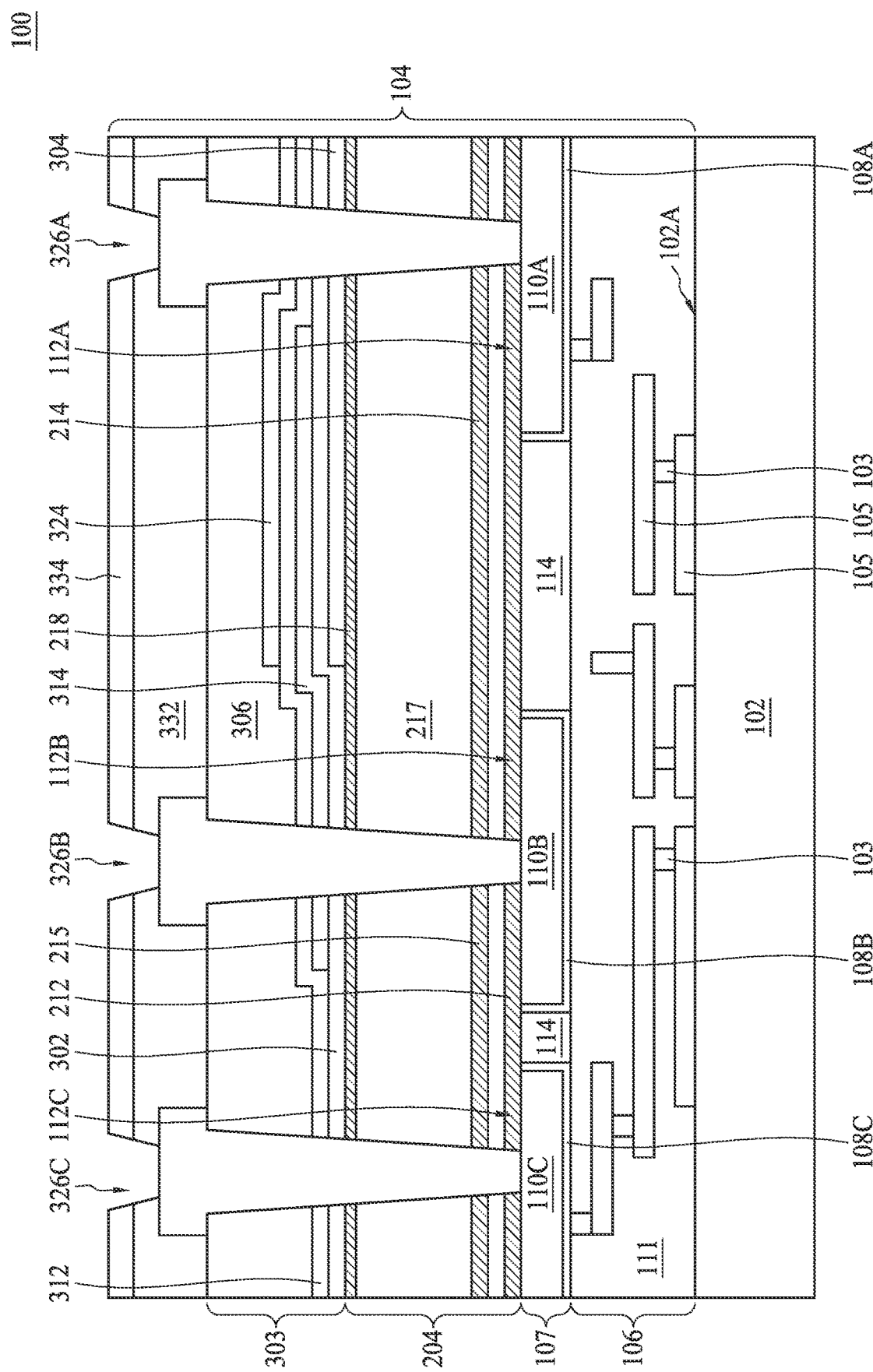

Referring to FIG. 12, a passivation structure 333 is formed over the conductive vias 322. The passivation structure 333 may include a first passivation sublayer 332 and a second passivation sublayer 334 over the first passivation sublayer 332. The first passivation sublayer 332 and the second passivation sublayer 334 are formed to include openings 326A, 326B and 326C, which extend through the first passivation sublayer 332 and the second passivation sublayer 334 and expose the respective conductive vias 322A, 322B and 322C.

In some embodiments, the first passivation sublayer 332 or the second passivation sublayer 334 is formed of dielectric materials, such as oxide, nitride, oxynitride, or the like. In some embodiments, the first passivation sublayer 332 or the second passivation sublayer 334 is formed of polyimide (PI), polybenzoxazole (PBO), benzocyclobuten (BCB), epoxy, silicone, acrylates, nano-filled pheno resin, siloxane, a fluorinated polymer, polynorbornene, or the like. In the present embodiment, the first passivation sublayer 332 is formed of silicon oxide and the second passivation sublayer 334 is formed of silicon nitride. The first passivation sublayer 332 and the second passivation sublayer 334 may be formed using CVD, PVD, spin-on coating, or other suitable method. In an embodiment, the passivation structure 333 are in a topmost layer of the capacitor structure 303 or the interconnect structure 104.

According to an embodiment, a method of manufacturing a semiconductor structure includes: forming an interconnect structure including a metallization layer over a substrate; depositing a first dielectric layer over the metallization layer; depositing a second dielectric layer over and separate from the first dielectric layer; depositing a third dielectric layer over the second dielectric layer, the third dielectric layer having a Young's modulus greater than that of the first and second dielectric layers; forming a capacitor structure over the third dielectric layer; and forming a conductive via extending through the capacitor structure and the first, second and third dielectric layers and electrically coupled to the metallization layer.

According to an embodiment, a method of manufacturing a semiconductor structure includes: forming an interconnect structure over a substrate; depositing a buffer structure over the interconnect structure, the buffer structure comprising first dielectric layers and second dielectric layers alternatingly arranged with the first dielectric layers, the second dielectric layers having a dielectric constant greater than that of the first dielectric layers; depositing a first conductive layer over the buffer structure; and forming a first conductive via extending through the first conductive layer and the buffer structure and electrically coupled to the interconnect structure.

According to an embodiment, a semiconductor structure includes an interconnect structure arranged over a substrate. The interconnect structure includes conductive lines and an inter-metal dielectric (IMD) layer electrically insulating the conductive lines. The semiconductor structure also includes a buffer structure over the interconnect structure, the buffer structure comprising first dielectric layers and second dielectric layers alternatingly arranged with the first dielectric layers, wherein the first dielectric layers has a Young's modulus greater than that of the second dielectric layers and that of the IMD layer. The semiconductor structure further includes a first conductive layer over the buffer structure, and a conductive via extending through the first conductive layer and the buffer structure and electrically coupled to the interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, the method comprising:
    forming an interconnect structure including a metallization layer over a substrate;
    depositing a first dielectric layer over the metallization layer;
    depositing a second dielectric layer over and separate from the first dielectric layer;
    depositing a third dielectric layer over the second dielectric layer, the third dielectric layer having a Young's modulus greater than that of the first and second dielectric layers;
    forming a capacitor structure over the third dielectric layer; and
    forming a conductive via extending through the capacitor structure and the first, second and third dielectric layers and electrically coupled to the metallization layer.

2. The method according to claim 1, wherein the first dielectric layer is configured to exert a first type stress on the conductive via while the third dielectric layer is configured to exert a second type stress on the conductive via.

3. The method according to claim 1, wherein the third dielectric layer is silicon nitride.

4. The method according to claim 1, wherein the third dielectric layer is in direct connect with the capacitor structure.

5. The method according to claim 1, further comprising performing a first treatment to release stress of the metallization layer, wherein a protrusion is formed on an upper surface of the metallization layer in response to the first treatment.

6. The method according to claim 5, further comprising performing a planarization operation to remove the protrusion.

7. The method according to claim 6, wherein the metallization layer comprises a conductive line including a seed layer and a filling material over the seed layer, wherein the planarization operation removes a thickness of the filling material.

8. The method according to claim 5, wherein the first treatment comprises a thermal operation.

9. The method according to claim 1, further comprising forming a fourth dielectric layer over the first dielectric layer prior to forming the second dielectric layer, wherein the third dielectric layer and the fourth dielectric layer are formed of a same material.

10. The method according to claim 1, wherein the conductive via is electrically coupled to the capacitor structure.

11. A method of manufacturing a semiconductor structure, the method comprising:
    forming an interconnect structure over a substrate;
    depositing a buffer structure over the interconnect structure, the buffer structure comprising first dielectric layers and second dielectric layers alternatingly arranged with the first dielectric layers, the second dielectric layers having a dielectric constant greater than that of the first dielectric layers;
    depositing a first conductive layer over the buffer structure; and
    forming a first conductive via extending through the first conductive layer and the buffer structure and electrically coupled to the interconnect structure.

12. The method according to claim 11, further comprising depositing a second conductive layer over the first conductive layer, wherein the first conductive layer forms a capacitor with the second conductive layer.

13. The method according to claim 12, further comprising forming a second conductive via extending through and electrically coupled to the second conductive layer.

14. The method according to claim 11, further comprising performing a planarization operation on the interconnect structure prior to forming the buffer structure.

15. The method according to claim 11, wherein forming an interconnect structure comprises:
    forming a conductive line in a topmost layer of the interconnect structure;
    performing a thermal operation on the interconnect structure; and
    thinning the conductive line subsequent to the thermal operation.

16. The method according to claim 15, wherein the thermal operation causes a protrusion on an upper surface of the conductive line, wherein the thinning removes the protrusion from the upper surface.

17. A method of manufacturing a semiconductor structure, the method comprising:
    forming an interconnect structure including a metallization layer over a substrate, wherein a first protrusion is formed on a surface of the interconnect structure;
    performing a planarization operation on the interconnect structure to eliminate the first protrusion;
    depositing a plurality of first dielectric layers and a plurality of second dielectric layers alternatively with the plurality of first dielectric layer over the interconnect structure, the second dielectric layers having a Young's modulus greater than that of the first dielectric layers and one of the first dielectric layers serve as a top dielectric layer over the rest of the first dielectric layers and the plurality of second dielectric layers; and
    forming an electrode of a capacitor structure on the top dielectric layer,
    wherein between the planarization operation and the forming of the capacitor structure, a second protrusion is formed on the surface of the interconnect structure, the second protrusion is fully covered by at least one of the first dielectric layers and the second dielectric layers.

18. The method according to claim 17, wherein the first dielectric layers are silicon nitride and the second dielectric layers are silicon oxide.

19. The method according to claim 17, wherein the second protrusion has a volume less than that of the first protrusion.

20. The method according to claim 17, wherein another one of the first dielectric layers serves as a bottom dielectric layer below the rest of the first dielectric layers and the plurality of second dielectric layers.

* * * * *